United States Patent [19]

Kwon

[11] Patent Number: 5,424,234
[45] Date of Patent: Jun. 13, 1995

[54] METHOD OF MAKING OXIDE SEMICONDUCTOR FIELD EFFECT TRANSISTOR

[75] Inventor: Ho Y. Kwon, Seoul, Rep. of Korea

[73] Assignee: Goldstar Electron Co., Ltd., Cheongju, Rep. of Korea

[21] Appl. No.: 206,208

[22] Filed: Mar. 3, 1994

Related U.S. Application Data

[63] Continuation-in-part of Ser. No. 891,763, Jun. 1, 1992, abandoned.

Foreign Application Priority Data

Jun. 13, 1991 [KR] Rep. of Korea ............... 9735/1991

[51] Int. Cl.⁶ .................................. H01L 21/336
[52] U.S. Cl. ........................................ 437/44; 437/27
[58] Field of Search ................. 437/40, 41, 44, 27; 257/336, 344

[56] References Cited

U.S. PATENT DOCUMENTS

| | | | |
|---|---|---|---|
| 4,728,617 | 3/1988 | Woo et al. | 437/44 |
| 4,818,714 | 4/1989 | Haskell | 437/34 |
| 4,843,023 | 6/1989 | Chiu et al. | 437/41 |
| 4,935,379 | 6/1990 | Toyoshima | 257/344 |
| 5,015,595 | 5/1991 | Wollesen | 437/41 |
| 5,102,816 | 4/1992 | Manukonda et al. | 257/344 |
| 5,153,145 | 10/1992 | Lee et al. | 437/44 |
| 5,171,700 | 12/1992 | Zamanian | 437/40 |
| 5,328,862 | 7/1994 | Goo | 437/44 |

FOREIGN PATENT DOCUMENTS

| | | | |
|---|---|---|---|
| 0195607 | 9/1986 | European Pat. Off. | 257/344 |
| 0439173 | 7/1991 | European Pat. Off. | 437/44 |
| 3709708 | 10/1987 | Germany | 437/44 |
| 2-219237 | 8/1099 | Japan | 437/44 |
| 60-234367 | 11/1985 | Japan | 257/344 |
| 61-234077 | 10/1986 | Japan | 257/344 |
| 63-66967 | 3/1988 | Japan | 257/344 |
| 2-161733 | 6/1990 | Japan | 437/44 |
| 3-272145 | 12/1991 | Japan | 437/44 |

*Primary Examiner*—Mary Wilczewski
*Attorney, Agent, or Firm*—Poms, Smith, Lande & Rose

[57] ABSTRACT

A method of making a MOSFET wherein a source/drain region is graded into three region portions having different concentrations. The method comprises the steps of forming a gate, an insulating film and a semiconductor film on a semiconductor substrate of a first conductivity type, and etching the insulating film and the semiconductor film to form gate side wall spacers. A first source/drain region is formed by implanting an impurity of a second conductivity type by using gate side wall spacers and a gate as a mask. After removing a portion of the semiconductor film corresponding to the upper portion of each gate side wall spacer, an impurity of the second conductivity type is implanted in the semiconductor substrate by using the remaining thin insulating film and the gate as a mask. The method also comprises the step of removing the remaining thin insulating film and implanting an impurity of the second conductivity type in the semiconductor substrate by using only the gate as a mask, to form a third source/drain region.

11 Claims, 10 Drawing Sheets

F I G .1(A)
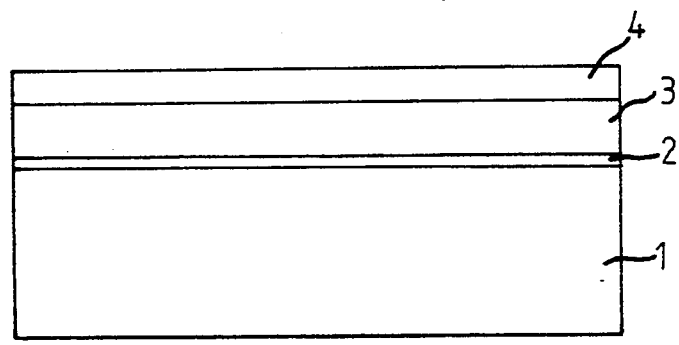
F I G .1(B)
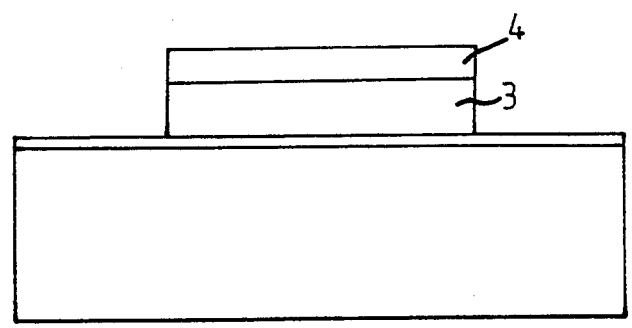
F I G .1(C)
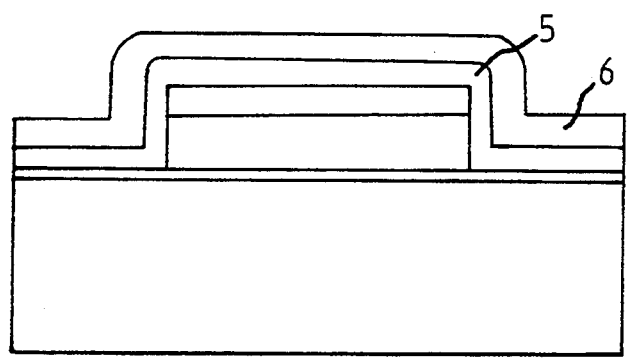

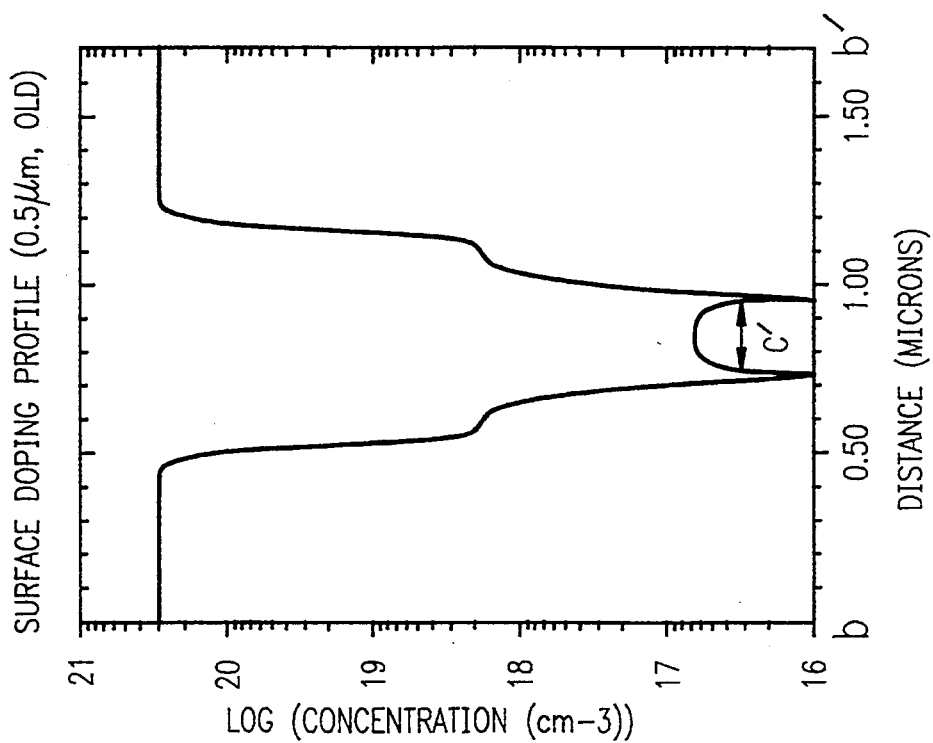
FIG. 2(A)
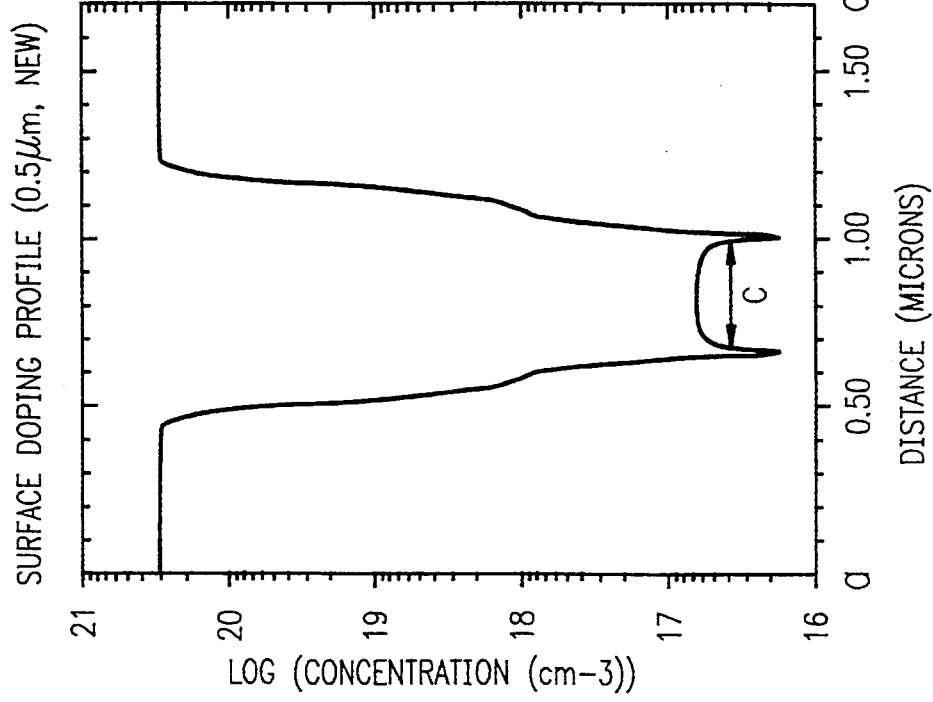
FIG. 2(B) *PRIOR ART*

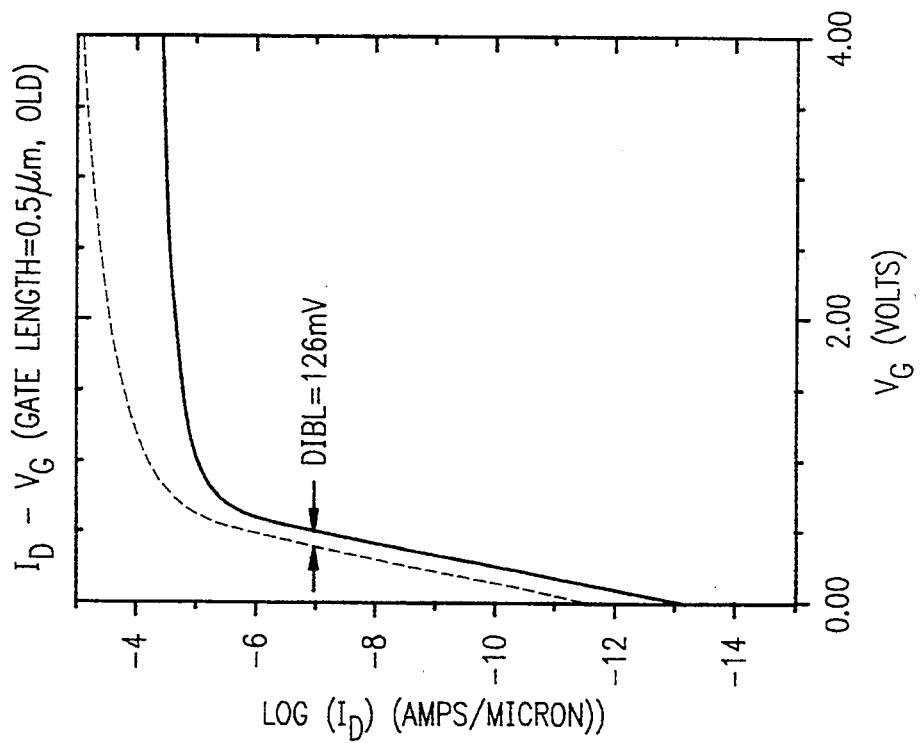
FIG. 3(B) _PRIOR ART_
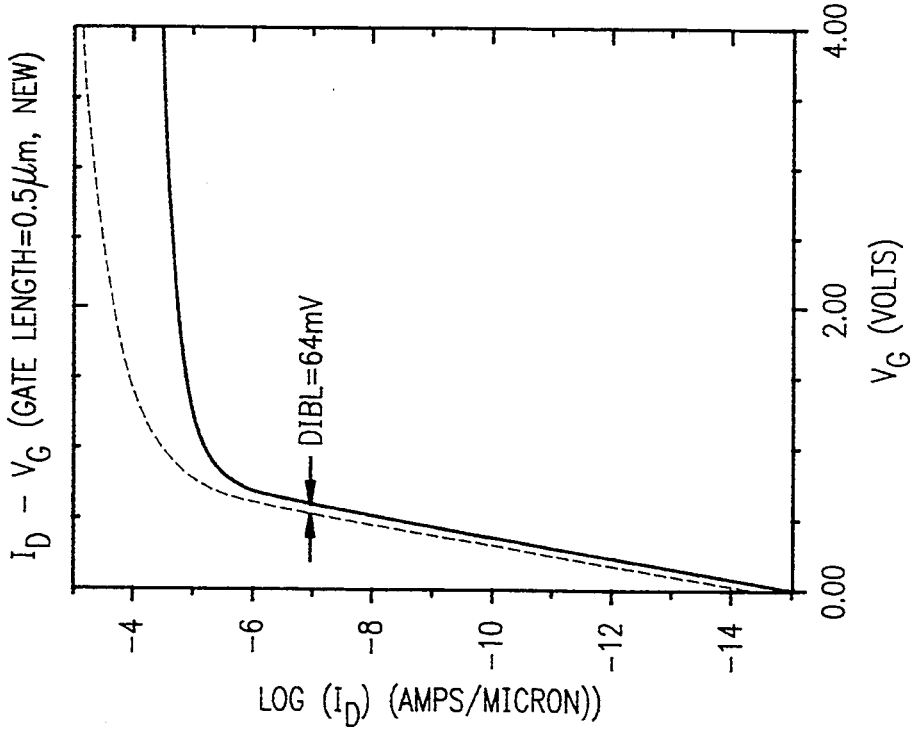
FIG. 3(A)

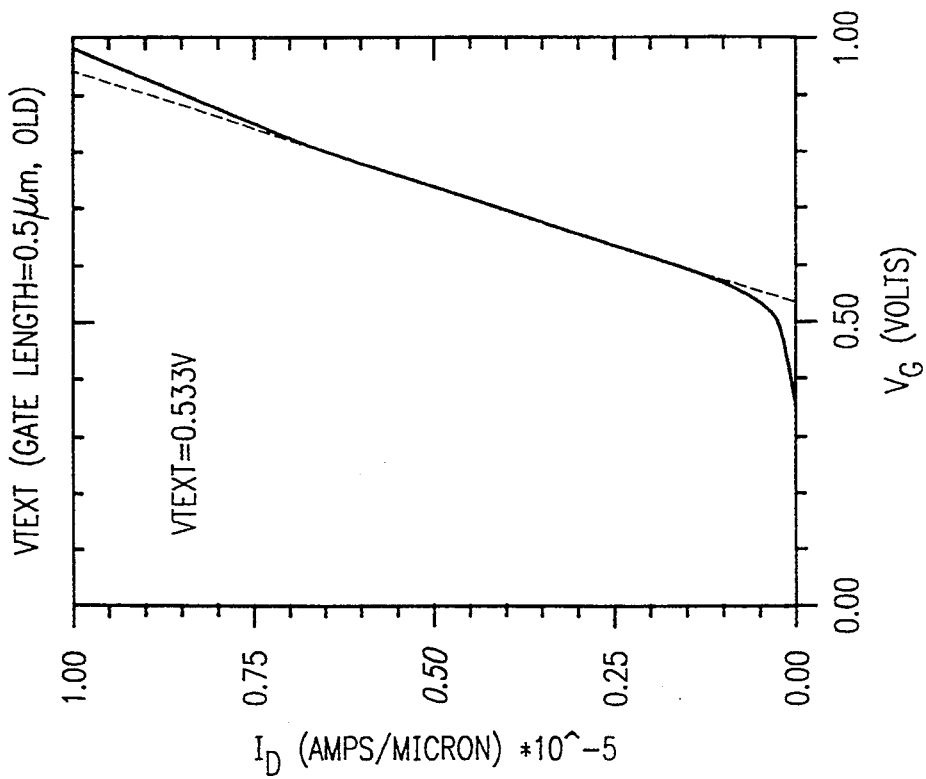
FIG. 4(B) _PRIOR ART_
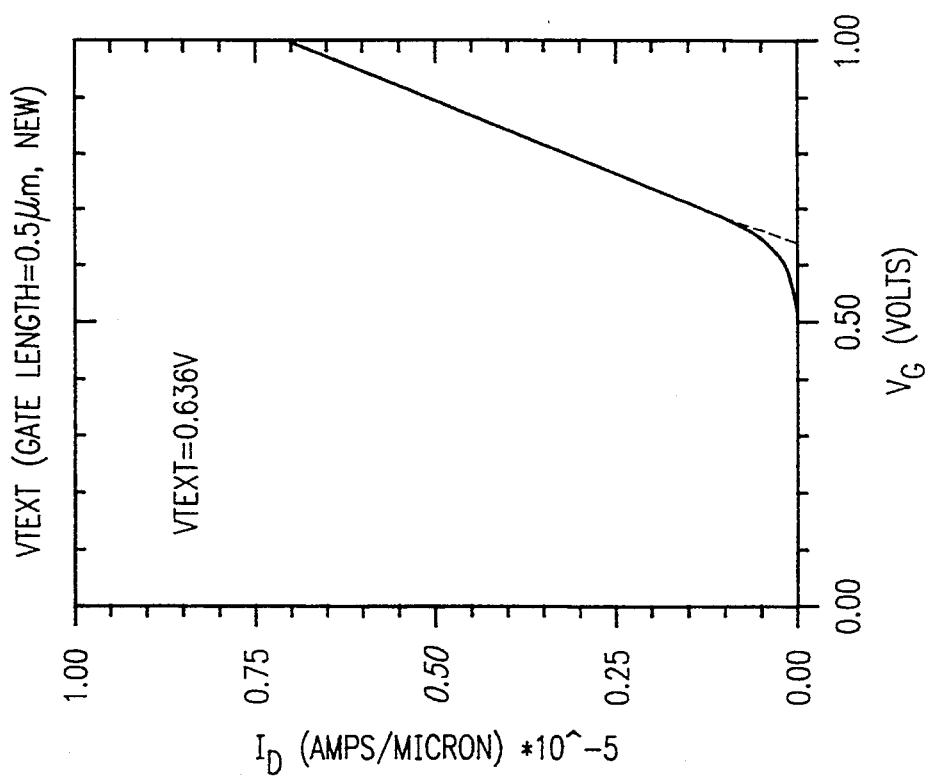
FIG. 4(A)

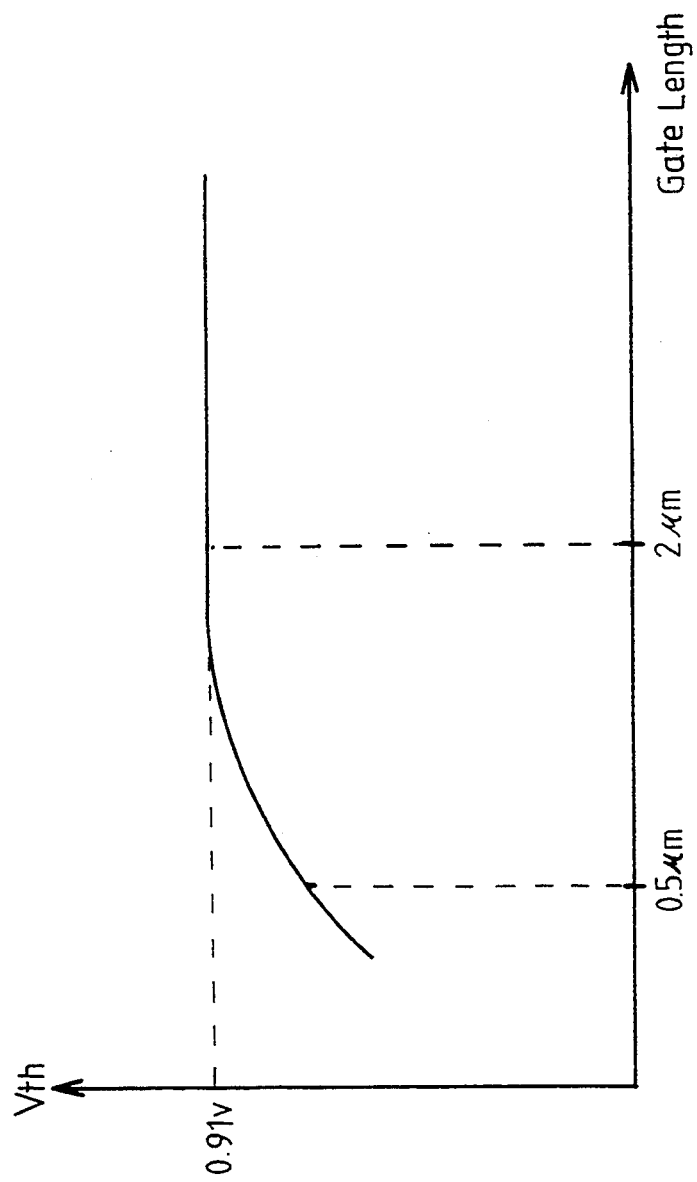

FIG. 7(B) *PRIOR ART*

METHOD OF MAKING OXIDE SEMICONDUCTOR FIELD EFFECT TRANSISTOR

This is a continuation-in-part of application Ser. No. 07/891,763, filed on Jun. 1, 1992, now abandoned.

BACKGROUND OF THE INVENTION

1. Field of the Invention

The present invention relates to a method of making a metal oxide semiconductor field effect transistor, and more particularly to a method of making metal oxide semiconductor field effect transistor with a lightly doped drain structure. The metal oxide semiconductor field effect transistor with a lightly doped drain structure according to the present invention avoids a generation of hot electrons due to a high electric field formed at edge portions of its gate electrode, thereby improving its life time and reliability.

2. Description of the Prior Art

Referring to FIGS. 8A to 8C, there is illustrated a conventional method of making a metal oxide semiconductor field effect transistor (MOSFET) with a lightly doped drain (LDD) structure.

On a P type semiconductor substrate 11, first, field regions 12 are formed to isolate adjacent cells from one another, as shown in FIG. 8A. Impurity ions for providing an electrical characteristic of MOSFET to be made are implanted in a portion of the surface of P type semiconductor substrate 11 corresponding to each active region located between adjacent field regions 12. Thereafter, a gate insulating film 13 is formed over the entire surface of P type semiconductor substrate 11 including the field regions 12. On the gate insulating film 13, a gate electrode 14 having a certain width is formed within each active region. The exposed surface of gate electrode 14 is subjected to an oxidization, thereby forming a gate cap insulating film 15. Over the entire exposed surface, a semiconductor layer 16 with a certain thickness is formed to provide gate side wall spacers.

Subsequently, the semiconductor layer 16 is subjected to an anisotropic etching using a reactive ion etching (RIE) method, thereby forming gate side wall semiconductor layers 17 at side walls of the gate electrode 14, respectively, as shown in FIG. 8B. At this time, the gate cap insulating film 15 formed on the surface of gate electrode 14 serves as an etch stopper. By using the gate cap insulating film 15 and gate side wall semiconductor layers 17 as a mask, N+ type (namely, high concentration) impurity ions are then implanted in a portion of the surface of P type semiconductor substrate 11 corresponding to the active region. According to a diffusion of the impurity ions, N+ type source and drain regions 18 and 18a are formed.

Thereafter, gate side wall semiconductor layers 17 are removed, as shown in FIG. 8C. By using the gate cap insulating film 15 as a mask, N− type (namely, low concentration) impurity ions are then implanted in a portion of the surface of P type semiconductor substrate 11 corresponding to the active region. According to a diffusion of the impurity ions, N− type source and drain regions 19 and 19a are formed.

Thus, the source/drain regions form a LDD structure comprising low and high concentration regions.

Now, an operation of the MOSFET made by the prior art will now be described, in conjunction with FIG. 9.

As a gate bias voltage $V_G$ (about 3.3 V) is applied to the gate electrode 14, a drain voltage $V_D$ (about 3.3 V) to the N+ drain region 18a and N− drain region 19a, and a minus substrate voltage $V_S$ to the P type semiconductor substrate 11, an inversion layer and a depletion layer are formed. In the N− type source region 19, electrons are generated which, turns, strike a lattice in N− type drain region 19a, thereby causing a generation of holes and electrons.

At this time, the generated electrons are injected into the N− type drain region 19a to which the plus voltage of about 3.3 V has been applied. However, the generated holes are moved to three regions. That is, the holes are not only trapped into the gate electrode 14 and the gate insulating film 13, but also often moved to the P type semiconductor substrate 11. The holes trapped in the gate electrode 14 may affect the overall circuit, but hardly have an effect on the operation of MOSFET. The holes moved to the P type semiconductor substrate 11 also have no effect on the operation of MOSFET, since they disappear in the P type semiconductor substrate 11. However, the holes trapped in the gate insulating film 13 cause the MOSFET to be turned on before the predetermined bias voltage $V_G$ of about 3.3 V is applied to the gate electrode 14.

As a result, the characteristic of MOSFET in operation and the reliability of a finally obtained element are reduced. Upon trapping of holes into the gate insulating film 13, furthermore, a defect may occur at the gate insulating film 13, thereby causing the performance of the element to be deteriorated and the life thereof to be shortened. Such holes are referred to as hot carriers and a phenomenon caused thereby is referred to as a hot carrier effect.

The prior aft also has a problem of an increase resistance, since the source/drain regions are constituted by N+ type and N− type regions. In addition, it is impossible to obtain source/drain regions having desired accurate widths, due to the difficulty of accurately controlling the thickness of the gate side wall semiconductor layers. Consequently, a short channel effect is caused.

SUMMARY OF THE INVENTION

Therefore, an object of the invention is to provide a method of making a MOSFET wherein a source/drain region is graded into three region portions having different concentrations, thereby avoiding a problem caused by an occurrence of hot carriers and a short channel effect.

In accordance with the present invention, this object can be accomplished by providing a method of making a metal oxide semiconductor field effect transistor comprising the steps of: forming a gate on a semiconductor substrate of a first type of conductivity; forming a thin insulating film and a semiconductor film on the entire exposed surface; etching the thin insulating film and the semiconductor film such that they remain only at side surfaces of the gate, to form gate side wall spacers; implanting an impurity of a second type of conductivity in the semiconductor substrate by using the gate side wall spacer and the gate as a mask, to form a first source/drain region having a predetermined impurity concentration; removing a portion of the semiconductor film corresponding to the upper portion of each gate side wall spacer and implanting an impurity of the second conductivity type in the semiconductor substrate by using the remaining thin insulating film and the gate as a mask, to form a second source/drain region having a predetermined impurity concentration; and removing the remaining thin insulating film and implanting an impurity of the second conductivity type in the semiconductor substrate by using only the gate as a mask, to form a third source/drain region having a predetermined impurity concentration.

BRIEF DESCRIPTION OF THE DRAWINGS

Other objects and aspects of the invention will become apparent from the following description of embodiments with reference to the accompanying drawings in which:

FIGS. 1A to 1F are sectional views illustrating a method of making a MOSFET in accordance with the present invention;

FIGS. 2A and 2B are surface doping profiles at surfaces of MOSFETs according to the present invention and the prior art, respectively;

FIGS. 3A and 3B are graphs showing respective drain induced barrier lowering (DIBL) values in MOSFETs according to the present invention and the prior art, respectively;

FIGS. 4A and 4B are graphs showing extrapolated threshold voltages in MOSFETs according to the present invention and the prior art, respectively;

FIG. 6 is a graph explaining a relationship between a gate length and a threshold voltage;

FIGS. 7A and 7B are potential profiles at substrate surfaces of MOSFETs according to the present invention and the prior art, respectively;

DETAILED DESCRIPTION OF THE PREFERRED EMBODIMENTS

Referring to FIGS. 1A to 1F, there is illustrated a method of making a MOSFET in accordance with the present invention.

First, on a P type semiconductor substrate 1, a gate insulating film 2, a gate electrode 3 and a gate cap insulating film 4 are formed in this order, as shown in FIG. 1A. Thereafter, their unnecessary portions are removed using a well-known photolithography method and a well-known dry etching method.

In this case, the gate insulating film 2 is composed of silicon oxide ($SiO_2$), the gate electrode 3 impurity doped polysilicon, and the gate cap insulating film 4 silicon oxide.

Figure 1D:
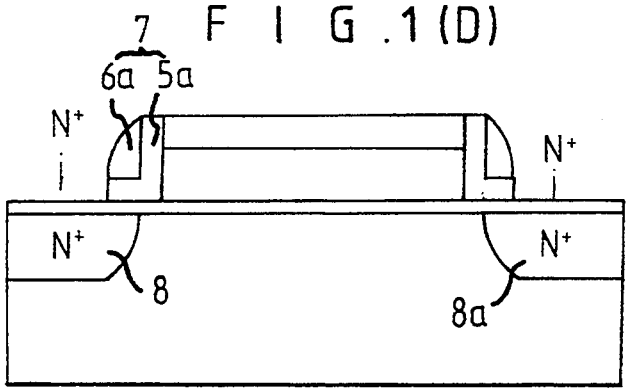

On the entire exposed surface, an insulating film 5 and a semiconductor film 6 to be used as gate side wall spacers are then formed using a chemical vapor deposition (CVD) method, as shown in FIG. 1C. In an alternative embodiment, the semiconductor film 6 can be replaced with a second insulating film having an etch selectivity different from that of the insulating film 5. The second insulating film may include silicon oxide. Thereafter, as shown in FIG. 1D, the insulating film 5 and the semiconductor film 6 are anisotropically etched using a reactive ion etching (RIE) method which is a kind of dry etching method. According to the anisotropic etching, the insulating film 5 and the semiconductor film 6 remain only at side surfaces of the gate electrode 3 and gate cap insulating film 4, thereby forming gate side wall spacers 7. During the anisotropic etching, the gate cap insulating film 4 and the gate insulating film 2 function as etch stopper layers.

By using the gate cap insulating film 4 and the gate side wall spacers 7 as a mask, $N^+$ type high concentration impurity ions are implanted in the surface of P type semiconductor substrate 1. According to a diffusion of the impurity ions, $N^+$ type source and drain regions 8 and 8a are formed, as shown in FIG. 1D.

In this case, the insulating film 5 is composed of silicon nitride, whereas the semiconductor film 6 is composed of undoped polysilicon. As the $N^+$ type impurity ions, phosphorous (P) ions or arsenic (As) ions are used.

Figure 1E:
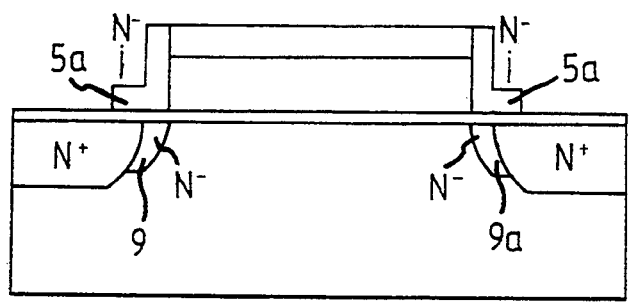

Thereafter, respective semiconductor film portions 6a remaining at upper portions of gate side wall spacers are removed, as shown in FIG. 1E. By using the remaining insulating film portions 5a and gate cap insulating film 4 as a mask, $N^-$ type relatively low concentration impurity ions ($N^+ > N^-$) are then implanted in the surface of P type semiconductor substrate 1. According to a diffusion of the impurity ions, $N^-$ type source and drain regions 9 and 9a are formed, as shown in FIG. 1E.

Figure 1F:
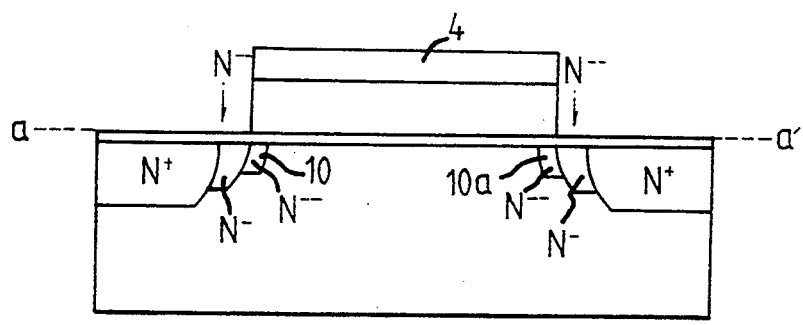

Finally, respective insulating film portions 5a remaining at lower portions of gate side wall spacers 7 are removed, as shown in FIG. 1F. $N^{--}$ type lower concentration impurity ions are then implanted and diffused in the surface of P type semiconductor substrate 1, to form $N^{--}$ type source and drain regions 10 and 10a. In similar to $N^+$ type impurity ions, $N^-$ type and $N^{--}$ type impurity ions are P ions or As ions.

Respective concentrations of $N^+$ type, $N^-$ type and $N^{--}$ type impurity ions can be properly controlled, depending upon a desired characteristic of MOSFET to be produced. In accordance with the present invention, there are provided three source/drain regions the closer one to the gate electrode 3 having the lower concentration. The source/drain regions form a curve with a gentle gradient.

In the illustrated embodiment of the present invention, a N type MOSFET has been exemplified. However, it is apparent that the present invention can be applied to a manufacture of P type MOSFET, by varying conductivity types of substrate and impurity ions for forming source/drain regions.

FIGS. 2A to 7B illustrate various data of a conventional N type MOSFET and a N type MOSFET according to the present invention. The used samples were prepared by modeling 64M DRAM in which its gate mask length is 0.5 μm.

By referring to the figures, the superiority of the present invention will now be described.

Figure 8A:
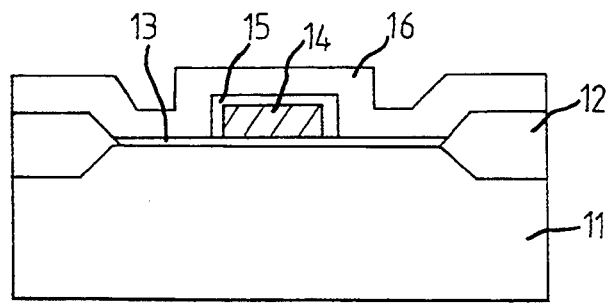
FIGS. 8A to 8C are sectional views illustrating a conventional method of making a MOSFET with a LDD structure.
Figure 8B:
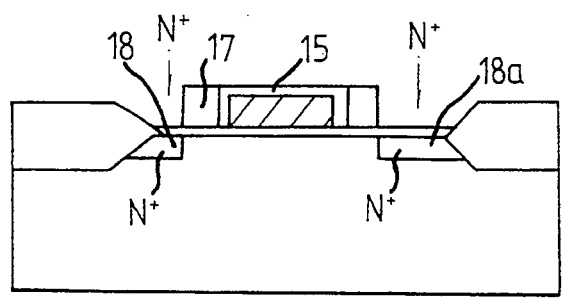
Figure 8C:
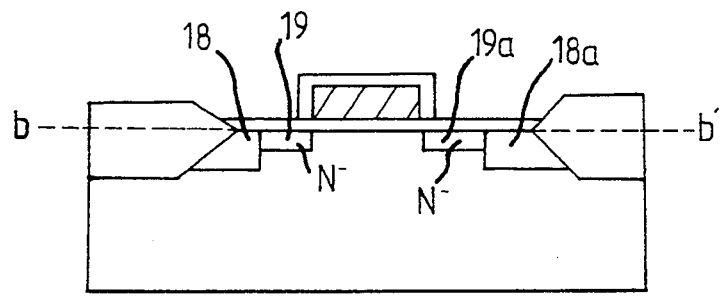
Figure 9:
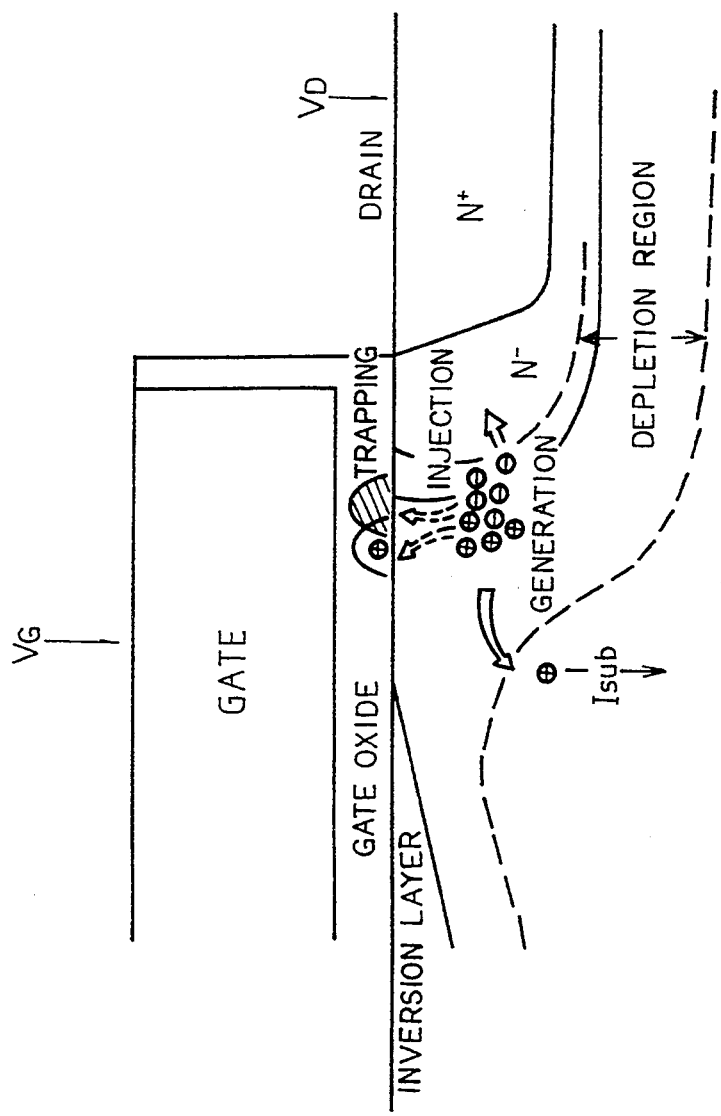
FIG. 9 is a view explaining an operation of the conventional MOSFET.

FIG. 2A shows a surface doping profile taken along the line a–a' in FIG. 1F illustrating a cross-section of the MOSFET made according to the present invention (hereinafter, referred to as new MOSFET). Whereas, FIG. 2B shows a surface doping profile taken along the line b–b' in FIG. 8C illustrating a cross-section of the MOSFET made according to the prior art (hereinafter, referred to as old MOSFET).

In FIGS. 2A and 2B, reference characters c and c' denote a channel length. As apparent from FIGS. 2A and 2B, the new MOSFET has a channel length closer to a predetermined gate mask length than that of the old MOSFET. In the new MOSFET, the length of a N type channel region defined after source/drain regions are formed using a side diffusion method was 0.33 μm. In case of the old MOSFET, the length was 0.23 μm. Accordingly, it can be found that the N type channel region length of the new MOSFET is longer than that of the old MOSFET, by 0.09 μm (about 20%).

FIGS. 3A and 3B are graphs showing respective drain induced barrier lowering (DIBL) values of the new MOSFET and old MOSFET. These DIBL values will now be briefly described.

Due to a drain voltage, the potential barrier defined between source and drain regions is lowered. As a result, a leakage occurs between source and drain regions, under the condition that gate voltage is lower than threshold voltage. DIBL value means such a leakage expressed in terms of the voltage value. FIG. 3A and 3B show a difference between gate voltages at drain voltages of 0.05 V and 3.3 V and a common drain current $I_D$. FIG. 3A is for the new MOSFET, while FIG. 3B is for the old MOSFET. The new MOSFET exhibits a DIBL value of about 64 mV, whereas the old MOSFET exhibits a DIBL value of about 126 mV considerably higher than that of the new MOSFET. Such a higher DIBL value results in an early turning-on of MOSFET before a predetermined gate bias voltage is fully applied, thereby causing the characteristic Of MOSFET in operation to be degraded. Such a degradation is more remarkably exhibited at the higher DIBL value, and particularly at the shorter channel length.

FIGS. 4A and 4B show extrapolated threshold voltages $V_{text}$ in the new MOSFET and the old MOSFET, respectively. On the other hand, FIG. 6 is a graph explaining a relationship between a gate length and a threshold voltage. As seen in FIG. 6, a threshold voltage of about 0.913 V is maintained at a gate length of not less than 2 μm. At a gate length of less than 2 μm, the threshold voltage decreases in proportion to the gate length. That is, as the gate length is reduced, the threshold voltage also decreases. This is because various short channel effects are caused by the reduction in the gate length. This phenomenon is more remarkably exhibited at a shorter gate length.

However, such a threshold voltage should be constant, irrespective of a variation in the gate length.

Referring FIGS. 4A and 4B, it can be found that when the channel length is reduced to 0.5 μm, the threshold voltage in case of N type MOSFET, which is 0.913 V at a long channel length of more than 0.5 μm, is reduced to 0.636 V in the new MOSFET and 0.533 V in the old MOSFET. Accordingly, it is apparent that the new MOSFET has a better threshold voltage characteristic, as compared with the old MOSFET.

Figure 5B:
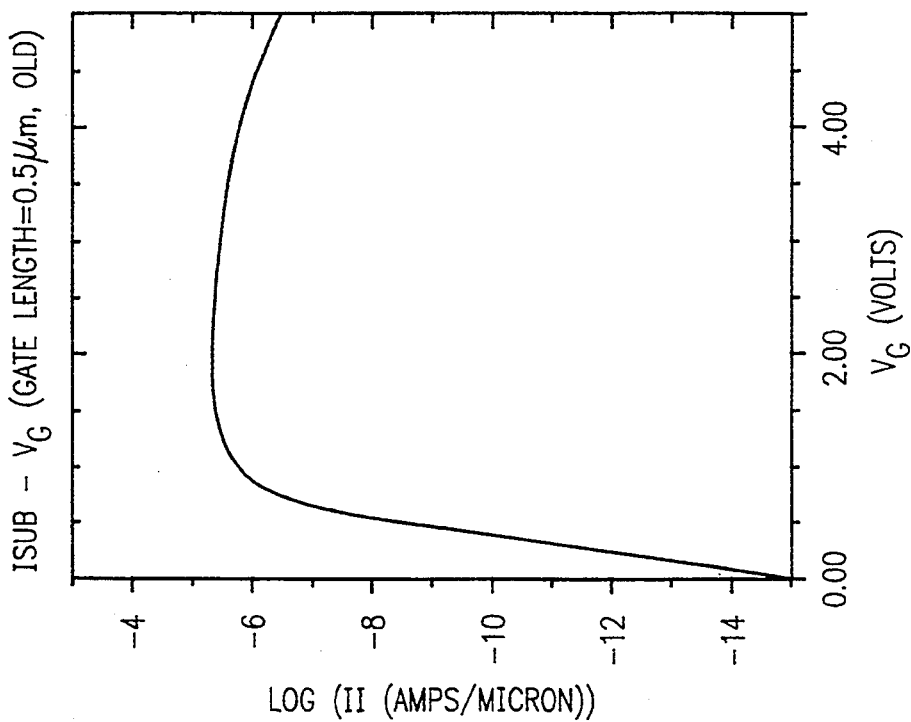
FIGS. 5A and 5B are graphs showing the quantity of holes flowing toward substrates of MOSFETs according to the present invention and the prior act, respectively.
Figure 5A:
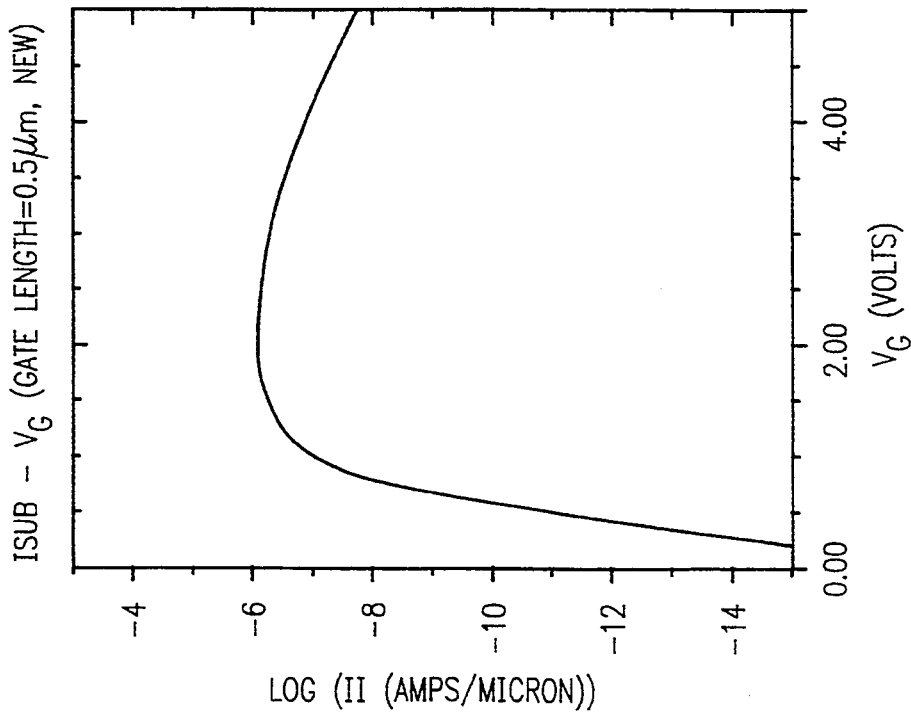

On the other hand, FIGS. 5A and 5B show currents, namely, hole values flowing through substrates of the new MOSFET and old MOSFET, respectively.

Upon an increase in the drain voltage, electrons flowing from a source region to a drain region move toward the drain region at a very high speed, by virtue of a strong electric field. At this time, the electrons strike a lattice near the drain region, thereby causing a generation of holes and electrons at the lattice region due to an impact ionization. In this case, the electrons enter the drain region. However, the holes are trapped in the gate insulating film or pass through the gate insulating film. The electrons passing through the gate insulating film enter the gate electrode or flow toward the substrate. The first case among the above three cases becomes a cause of degrading the characteristic of MOSFET. In actual, however, it is impossible to directly calculate the quantity of holes trapped in the gate insulating film. Instead, the quantity of current flowing toward the substrate is calculated. That is, assuming that the quantity of holes trapped in the gate insulating film is proportioned to the quantity of holes flowing toward the substrate, the degradation of MOSFET caused by hot carriers (namely, holes) is determined, according to the quantity of current flowing toward the substrate.

Such a degradation of MOSFET caused by hot carriers can be reduced by the following three method:

First, reducing a generation of holes due to the impact ionization;

Second, avoiding the generated holes from flowing toward the gate insulating film; and Third, avoiding the holes flowing toward the gate insulating film from being trapped in the same film.

The present invention achieves a reduction in generation of holes, by reducing the intensity of an electric field near the drain region. This method corresponds to the above-mentioned first case.

By referring to FIGS. 5A and 5B, it can be found that the level of a current $I_{sub}$ flowing the substrate in the new MOSFET is higher than that in the old MOSFET. The maximum substrate current: $I_{sub.max}$ in the old MOSFET is $4.93 \times 10^{-6}$ A/μm at 2.0 V of gate voltage $V_G$. On the other hand, the maximum substrate current $I_{sub.max}$ in the new MOSFET is $9.13 \times 10^{-7}$ A/μm at 1.8 V of gate voltage $V_G$. Accordingly, it can be found that the new MOSFET has the maximum substrate current decreased by about 20%, as compared with the old MOSFET.

Figure 7A:
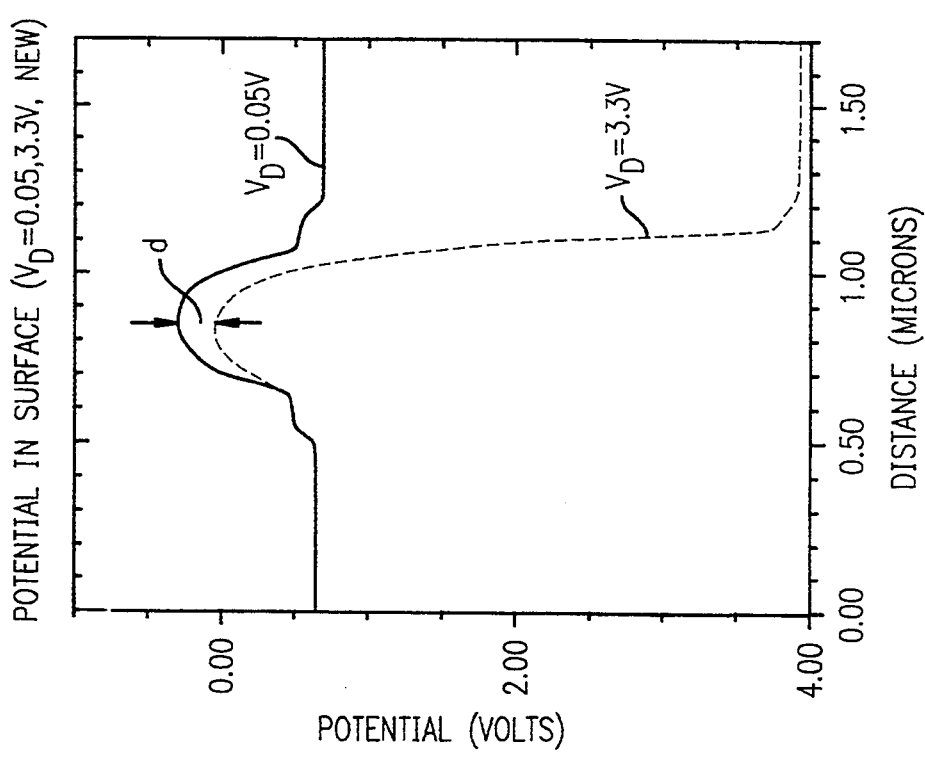

FIGS. 7A and 7B show potential profiles at substrate surfaces of the new MOSFET and old MOSFET, respectively. These potential profiles correspond to the cases when their drain voltages $V_D$ are 0.5 V and 3.3 V, respectively. Such a potential profile has a relationship with DIBL value. At higher DIBL value, potential drop widths d and d' become increase, thereby causing an increase in the quantity of leakage current prior to turning-on of MOSFET. As a result, the MOSFET may be early turned on, before a predetermined gate bias voltage is applied thereto, so that it may real function.

By referring to FIGS. 7A and 7B, it can be found that the new MOSFET has a potential drop width lower than that of the old MOSFET.

From the above-mentioned four measurements, it is verified that the new MOSFET according to the present invention has superior effects, as compared with the old MOSFET.

Although the preferred embodiments of the invention have been disclosed for illustrative purpose, those skilled in the art will appreciated that various modifications, additions and substitutions are possible, without departing from the scope and spirit of the invention as disclosed in the accompanying claims.

What is claimed is:

1. A method of making a metal oxide semiconductor field effect transistor comprising the steps of:

forming a gate on a semiconductor substrate of a first type of conductivity;

forming a thin insulating film and a semiconductor film on the gate and substrate;

etching the thin insulating film and the semiconductor film such that the films remain only at side surfaces of the gate, to form gate sidewall spacers;

implanting an impurity of a second type of conductivity in the semiconductor substrate by using the gate sidewall spacers and the gate as a mask, to form a first source/drain region having a first impurity concentration;

removing a portion of the semiconductor film corresponding to an upper portion of each gate sidewall spacers and implanting an impurity of the second conductivity type in the semiconductor substrate by using the remaining thin insulating film and the gate as a mask, to form a second source/drain region having a second impurity concentration; and removing the remaining thin insulating film and implanting an impurity of the second conductivity type in the semiconductor substrate by using only the gate as a mask, to form a third source/drain region having a third impurity concentration.

2. A method of making a metal oxide semiconductor field effect transistor in accordance with claim 1, wherein the first to third source/drain regions have different impurity concentrations such that the first source/drain region and the third source/drain region have the largest impurity concentration and the smallest impurity concentration, respectively.

3. A method of making a metal oxide semiconductor field effect transistor in accordance with claim 1, wherein the thin insulating film has a small thickness which allows the passage of ions of the impurities therethrough.

4. A method of making a metal oxide semiconductor field effect transistor in accordance with claim 3, wherein the thin insulating film is composed of silicon nitride.

5. A method of making a metal oxide semiconductor field effect transistor in accordance with claim 1, wherein the semiconductor film is composed of undoped polysilicon.

6. A method of making a metal oxide semiconductor field effect transistor in accordance with claim 1, wherein the step of etching the thin insulating film and the semiconductor film is an anisotropic dry etching step.

7. A method of making a metal oxide semiconductor field effect transistor in accordance with claim 6, wherein the anisotropic dry etching step is a reactive ion etching step.

8. A method of making a metal oxide semiconductor field effect transistor in accordance with claim 1, wherein the gate comprises a gate insulating film, a gate electrode and a gate cap insulating film which are formed, in this order.

9. A method of making a metal oxide semiconductor field effect transistor in accordance with claim 8, wherein the gate insulating film and the gate cap insulating film are composed of silicon oxide, and the gate electrode is composed of doped polysilicon.

10. A method of making a metal oxide semiconductor field effect transistor comprising the steps of:

forming a gate on a semiconductor substrate of a first type of conductivity;

forming a thin insulating film on the gate and the semiconductor substrate;

forming a second insulating film having an etch selectivity different from that of the thin insulating film on the gate and the semiconductor substrate;

etching the thin insulating film and the second insulating film such that the films remain only at side surfaces of the gate, to form gate sidewall spacers;

implanting an impurity of a second type of conductivity in the semiconductor substrate by using the gate sidewall spacers and the gate as a mask, to form a first source/drain region having a first impurity concentration;

removing a portion of the second insulating film corresponding to an upper portion of each gate sidewall spacers and implanting an impurity of the second conductivity type in the semiconductor substrate by using the remaining thin insulating film and the gate as a mask, to form a second source/drain region having a second impurity concentration; and removing the remaining thin insulating film and implanting an impurity of the second conductivity type in the semiconductor substrate by using only the gate as a mask, to form a third source/drain region having a third impurity concentration.

11. A method of making a metal oxide semiconductor field effect transistor in accordance with claim 10, wherein the second insulating film includes silicon oxide.

* * * * *